(12) United States Patent
Liang et al.

(10) Patent No.: US 6,885,065 B2
(45) Date of Patent: Apr. 26, 2005

(54) FERROMAGNETIC SEMICONDUCTOR STRUCTURE AND METHOD FOR FORMING THE SAME

(75) Inventors: Yong Liang, Gilbert, AZ (US); Ravindranath Droopad, Chandler, AZ (US); Hao Li, Chandler, AZ (US); Zhiyi Yu, Gilbert, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/299,801

(22) Filed: Nov. 20, 2002

(65) Prior Publication Data

US 2004/0094801 A1 May 20, 2004

(51) Int. Cl.$^7$ ............................................... H01L 29/72
(52) U.S. Cl. ..................... 257/347; 257/348; 257/350
(58) Field of Search ................................ 257/347, 348, 257/350

(56) References Cited

U.S. PATENT DOCUMENTS

| | | |
|---|---|---|
| 3,617,951 A | 11/1971 | Anderson |
| 3,670,213 A | 6/1972 | Nakawaga et al. |
| 3,758,199 A | 9/1973 | Thaxter |
| 3,766,370 A | 10/1973 | Walther |
| 3,802,967 A | 4/1974 | Ladany et al. |
| 3,818,451 A | 6/1974 | Coleman |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,174,504 A | 11/1979 | Chenausky et al. |
| 4,177,094 A | 12/1979 | Kroon |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,298,247 A | 11/1981 | Michelet et al. |

(Continued)

FOREIGN PATENT DOCUMENTS

| | | |
|---|---|---|
| DE | 196 07 107 | 8/1997 |
| DE | 197 12 496 | 10/1997 |
| DE | 198 29 609 | 1/2000 |
| DE | 100 17 137 | 10/2000 |
| EP | 0 247 722 | 12/1987 |
| EP | 0 250 171 | 12/1987 |
| EP | 0 300 499 | 1/1989 |
| EP | 0 309 270 | 3/1989 |
| EP | 0 331 338 | 9/1989 |
| EP | 0 331 467 | 9/1989 |
| EP | 0 342 937 | 11/1989 |
| EP | 0 392 714 | 10/1990 |
| EP | 0 412 002 | 2/1991 |
| EP | 0 455 526 | 6/1991 |
| EP | 0 483 993 | 5/1992 |

(Continued)

OTHER PUBLICATIONS

Chambers et al, "Epitaxial growth and properties of ferromagnetic co–doped TiO2 anatase", Nov. 19, 2001, Applied Physics Letters, vol. 79, No. 21, pp. 3469.*

(Continued)

*Primary Examiner*—Edward Wojciechowicz
(74) *Attorney, Agent, or Firm*—Oblon, Spivak, McClelland, Maier & Neustadt, P.C.

(57) ABSTRACT

A ferromagnetic semiconductor structure is provided. The structure includes a monocrystalline semiconductor substrate and a doped titanium oxide anatase layer overlying the semiconductor substrate.

15 Claims, 1 Drawing Sheet

U.S. PATENT DOCUMENTS

| | | |
|---|---|---|
| 4,378,259 A | 3/1983 | Hasegawa et al. |
| 4,392,297 A | 7/1983 | Little |
| 4,398,342 A | 8/1983 | Pitt et al. |
| 4,404,265 A | 9/1983 | Manasevit |
| 4,424,589 A | 1/1984 | Thomas et al. |
| 4,439,014 A | 3/1984 | Stacy et al. |
| 4,442,590 A | 4/1984 | Stockton et al. |
| 4,447,116 A | 5/1984 | King et al. |
| 4,452,720 A | 6/1984 | Harada et al. |
| 4,459,325 A | 7/1984 | Nozawa et al. |
| 4,482,422 A | 11/1984 | McGinn et al. |
| 4,482,906 A | 11/1984 | Hovel et al. |
| 4,484,332 A | 11/1984 | Hawrylo |
| 4,503,540 A | 3/1985 | Nakashima et al. |
| 4,523,211 A | 6/1985 | Morimoto et al. |
| 4,525,871 A | 7/1985 | Foyt et al. |
| 4,594,000 A | 6/1986 | Falk et al. |
| 4,626,878 A | 12/1986 | Kuwano et al. |
| 4,629,821 A | 12/1986 | Bronstein-Bonte et al. |
| 4,661,176 A | 4/1987 | Manasevit |
| 4,667,088 A | 5/1987 | Kramer |
| 4,667,212 A | 5/1987 | Nakamura |
| 4,681,982 A | 7/1987 | Yoshida |
| 4,695,120 A | 9/1987 | Holder |
| 4,723,321 A | 2/1988 | Saleh |
| 4,748,485 A | 5/1988 | Vasudev |
| 4,756,007 A | 7/1988 | Qureshi et al. |
| 4,772,929 A | 9/1988 | Manchester et al. |
| 4,773,063 A | 9/1988 | Hunsperger et al. |
| 4,774,205 A | 9/1988 | Choi et al. |
| 4,777,613 A | 10/1988 | Shahan et al. |
| 4,793,872 A | 12/1988 | Meunier et al. |
| 4,801,184 A | 1/1989 | Revelli |
| 4,802,182 A | 1/1989 | Thornton et al. |
| 4,804,866 A | 2/1989 | Akiyama |
| 4,815,084 A | 3/1989 | Scifres et al. |
| 4,841,775 A | 6/1989 | Ikeda et al. |
| 4,843,609 A | 6/1989 | Ohya et al. |
| 4,845,044 A | 7/1989 | Ariyoshi et al. |
| 4,846,926 A | 7/1989 | Kay et al. |
| 4,855,249 A | 8/1989 | Akasaki et al. |
| 4,866,489 A | 9/1989 | Yokogawa et al. |
| 4,868,376 A | 9/1989 | Lessin et al. |
| 4,872,046 A | 10/1989 | Morkoc et al. |
| 4,876,208 A | 10/1989 | Gustafson et al. |
| 4,876,218 A | 10/1989 | Pessa et al. |
| 4,876,219 A | 10/1989 | Eshita et al. |
| 4,882,300 A | 11/1989 | Inoue et al. |
| 4,885,376 A | 12/1989 | Verkade |
| 4,888,202 A | 12/1989 | Murakami et al. |
| 4,889,402 A | 12/1989 | Reinhart |
| 4,891,091 A | 1/1990 | Shastry |
| 4,896,194 A | 1/1990 | Suzuki |
| 4,901,133 A | 2/1990 | Curran et al. |
| 4,910,164 A | 3/1990 | Shichijo |
| 4,912,087 A | 3/1990 | Aslam et al. |
| 4,928,154 A | 5/1990 | Umeno et al. |
| 4,934,777 A | 6/1990 | Jou et al. |
| 4,952,420 A | 8/1990 | Walters |
| 4,959,702 A | 9/1990 | Moyer et al. |
| 4,963,508 A | 10/1990 | Umeno et al. |
| 4,963,949 A | 10/1990 | Wanlass et al. |
| 4,965,649 A | 10/1990 | Zanio et al. |
| 4,981,714 A | 1/1991 | Ohno et al. |
| 4,984,043 A | 1/1991 | Vinal |
| 4,999,842 A | 3/1991 | Huang et al. |
| 5,018,816 A | 5/1991 | Murray et al. |
| 5,028,563 A | 7/1991 | Feit et al. |
| 5,028,976 A | 7/1991 | Ozaki et al. |
| 5,051,790 A | 9/1991 | Hammer |
| 5,053,835 A | 10/1991 | Horikawa et al. |
| 5,055,445 A | 10/1991 | Belt et al. |
| 5,055,835 A | 10/1991 | Sutton |
| 5,057,694 A | 10/1991 | Idaka et al. |
| 5,060,031 A | 10/1991 | Abrokwah et al. |
| 5,063,081 A | 11/1991 | Cozzette et al. |
| 5,063,166 A | 11/1991 | Mooney et al. |
| 5,064,781 A | 11/1991 | Cambou et al. |
| 5,067,809 A | 11/1991 | Tsubota |
| 5,073,981 A | 12/1991 | Giles et al. |
| 5,075,743 A | 12/1991 | Behfar-Rad |
| 5,081,062 A | 1/1992 | Vasudev et al. |
| 5,081,519 A | 1/1992 | Nishimura et al. |
| 5,087,829 A | 2/1992 | Ishibashi et al. |
| 5,103,494 A | 4/1992 | Mozer |
| 5,116,461 A | 5/1992 | Lebby et al. |
| 5,119,448 A | 6/1992 | Schaefer et al. |
| 5,122,679 A | 6/1992 | Ishii et al. |
| 5,122,852 A | 6/1992 | Chan et al. |
| 5,127,067 A | 6/1992 | Delcoco et al. |
| 5,130,762 A | 7/1992 | Kulick |
| 5,132,648 A | 7/1992 | Trinh et al. |
| 5,140,387 A | 8/1992 | Okazaki et al. |
| 5,140,651 A | 8/1992 | Soref et al. |
| 5,141,894 A | 8/1992 | Bisaro et al. |
| 5,143,854 A | 9/1992 | Pirrung et al. |
| 5,144,409 A | 9/1992 | Ma |
| 5,148,504 A | 9/1992 | Levi et al. |
| 5,155,658 A | 10/1992 | Inam et al. |
| 5,159,413 A | 10/1992 | Calviello et al. |
| 5,163,118 A | 11/1992 | Lorenzo et al. |
| 5,166,761 A | 11/1992 | Olson et al. |
| 5,173,474 A | 12/1992 | Connell et al. |
| 5,173,835 A | 12/1992 | Cornett et al. |
| 5,181,085 A | 1/1993 | Moon et al. |
| 5,185,589 A | 2/1993 | Krishnaswamy et al. |
| 5,188,976 A | 2/1993 | Kume et al. |
| 5,191,625 A | 3/1993 | Gustavsson |
| 5,194,397 A | 3/1993 | Cook et al. |
| 5,194,917 A | 3/1993 | Regener |
| 5,198,269 A | 3/1993 | Swartz et al. |
| 5,208,182 A | 5/1993 | Narayan et al. |
| 5,210,763 A | 5/1993 | Lewis et al. |
| 5,216,359 A | 6/1993 | Makki et al. |
| 5,216,729 A | 6/1993 | Berger et al. |
| 5,221,367 A | 6/1993 | Chisholm et al. |
| 5,225,031 A | 7/1993 | McKee et al. |
| 5,227,196 A | 7/1993 | Itoh |
| 5,238,877 A | 8/1993 | Russell |
| 5,244,818 A | 9/1993 | Jokers et al. |
| 5,248,564 A | 9/1993 | Ramesh |
| 5,260,394 A | 11/1993 | Tazaki et al. |
| 5,262,659 A | 11/1993 | Grudkowski et al. |
| 5,266,355 A | 11/1993 | Wernberg et al. |
| 5,268,327 A | 12/1993 | Vernon |
| 5,270,298 A | 12/1993 | Ramesh |
| 5,280,013 A | 1/1994 | Newman et al. |
| 5,281,834 A | 1/1994 | Cambou et al. |
| 5,283,462 A | 2/1994 | Stengel |
| 5,286,985 A | 2/1994 | Taddiken |
| 5,293,050 A | 3/1994 | Chapple-Sokol et al. |
| 5,306,649 A | 4/1994 | Hebert |
| 5,310,707 A | 5/1994 | Oishi et al. |
| 5,312,765 A | 5/1994 | Kanber |
| 5,313,058 A | 5/1994 | Friederich et al. |
| 5,314,547 A | 5/1994 | Heremans et al. |
| 5,315,128 A | 5/1994 | Hunt et al. |
| 5,323,023 A | 6/1994 | Fork |
| 5,326,721 A | 7/1994 | Summerfelt |
| 5,334,556 A | 8/1994 | Guldi |
| 5,352,926 A | 10/1994 | Andrews |

| | | | | | | |
|---|---|---|---|---|---|---|
| 5,356,509 A | 10/1994 | Terranova et al. | | 5,540,785 A | 7/1996 | Dennard et al. |
| 5,356,831 A | 10/1994 | Calviello et al. | | 5,541,422 A | 7/1996 | Wolf et al. |
| 5,357,122 A | 10/1994 | Okubora et al. | | 5,548,141 A | 8/1996 | Morris et al. |
| 5,358,925 A | 10/1994 | Neville Connell et al. | | 5,549,977 A | 8/1996 | Jin et al. |
| 5,362,972 A | 11/1994 | Yazawa et al. | | 5,551,238 A | 9/1996 | Prueitt |
| 5,362,998 A | 11/1994 | Iwamura et al. | | 5,552,547 A | 9/1996 | Shi |
| 5,365,477 A | 11/1994 | Cooper, Jr. et al. | | 5,553,089 A | 9/1996 | Seki et al. |
| 5,371,621 A | 12/1994 | Stevens | | 5,556,463 A | 9/1996 | Guenzer |
| 5,371,734 A | 12/1994 | Fischer | | 5,559,368 A | 9/1996 | Hu et al. |
| 5,372,992 A | 12/1994 | Itozaki et al. | | 5,561,305 A | 10/1996 | Smith |
| 5,373,166 A | 12/1994 | Buchan et al. | | 5,569,953 A | 10/1996 | Kikkawa et al. |
| 5,387,811 A | 2/1995 | Saigoh | | 5,570,226 A | 10/1996 | Ota |
| 5,391,515 A | 2/1995 | Kao et al. | | 5,572,052 A | 11/1996 | Kashihara et al. |
| 5,393,352 A | 2/1995 | Summerfelt | | 5,574,296 A | 11/1996 | Park et al. |
| 5,394,489 A | 2/1995 | Koch | | 5,574,589 A | 11/1996 | Feuer et al. |
| 5,395,663 A | 3/1995 | Tabata et al. | | 5,574,744 A | 11/1996 | Gaw et al. |
| 5,397,428 A | 3/1995 | Stoner et al. | | 5,576,879 A | 11/1996 | Nashimoto |
| 5,399,898 A | 3/1995 | Rostoker | | 5,578,162 A | 11/1996 | D'Asaro et al. |
| 5,404,581 A | 4/1995 | Honjo | | 5,585,167 A | 12/1996 | Satoh et al. |
| 5,405,802 A | 4/1995 | Yamagata et al. | | 5,585,288 A | 12/1996 | Davis et al. |
| 5,406,202 A | 4/1995 | Mehrgardt et al. | | 5,588,995 A | 12/1996 | Sheldon |
| 5,410,622 A | 4/1995 | Okada et al. | | 5,589,284 A | 12/1996 | Summerfelt et al. |
| 5,418,216 A | 5/1995 | Fork | | 5,596,205 A | 1/1997 | Reedy et al. |
| 5,418,389 A | 5/1995 | Watanabe | | 5,596,214 A | 1/1997 | Endo |
| 5,420,102 A | 5/1995 | Harshavardhan et al. | | 5,602,418 A | 2/1997 | Imai et al. |
| 5,427,988 A | 6/1995 | Sengupta et al. | | 5,603,764 A | 2/1997 | Matsuda et al. |
| 5,430,397 A | 7/1995 | Itoh et al. | | 5,606,184 A | 2/1997 | Abrokwah et al. |
| 5,436,759 A | 7/1995 | Dijail et al. | | 5,608,046 A | 3/1997 | Cook et al. |
| 5,438,584 A | 8/1995 | Paoli et al. | | 5,610,744 A | 3/1997 | Ho et al. |
| 5,441,577 A | 8/1995 | Sasaki et al. | | 5,614,739 A | 3/1997 | Abrokwah et al. |
| 5,442,191 A | 8/1995 | Ma | | 5,619,051 A | 4/1997 | Endo |
| 5,442,561 A | 8/1995 | Yoshizawa et al. | | 5,621,227 A | 4/1997 | Joshi |
| 5,444,016 A | 8/1995 | Abrokwah et al. | | 5,623,439 A | 4/1997 | Gotoh et al. |
| 5,446,719 A | 8/1995 | Yoshida et al. | | 5,623,552 A | 4/1997 | Lane |
| 5,450,812 A | 9/1995 | McKee et al. | | 5,629,534 A | 5/1997 | Inuzuka et al. |
| 5,452,118 A | 9/1995 | Maruska | | 5,633,724 A | 5/1997 | King et al. |
| 5,453,727 A | 9/1995 | Shibasaki et al. | | 5,635,433 A | 6/1997 | Sengupta |
| 5,466,631 A | 11/1995 | Ichikawa et al. | | 5,635,453 A | 6/1997 | Pique et al. |
| 5,473,047 A | 12/1995 | Shi | | 5,640,267 A | 6/1997 | May et al. |
| 5,473,171 A | 12/1995 | Summerfelt | | 5,642,371 A | 6/1997 | Tohyama et al. |
| 5,477,363 A | 12/1995 | Matsuda | | 5,650,646 A | 7/1997 | Summerfelt |
| 5,478,653 A | 12/1995 | Guenzer | | 5,656,382 A | 8/1997 | Nashimoto |
| 5,479,033 A | 12/1995 | Baca et al. | | 5,659,180 A | 8/1997 | Shen et al. |
| 5,479,317 A | 12/1995 | Ramesh | | 5,661,112 A | 8/1997 | Hatta et al. |
| 5,480,829 A | 1/1996 | Abrokwah et al. | | 5,666,376 A | 9/1997 | Cheng |
| 5,481,102 A | 1/1996 | Hazelrigg, Jr. | | 5,667,586 A | 9/1997 | Ek et al. |
| 5,482,003 A | 1/1996 | McKee et al. | | 5,668,048 A | 9/1997 | Kondo et al. |
| 5,484,664 A | 1/1996 | Kitahara et al. | | 5,670,798 A | 9/1997 | Schetzina |
| 5,486,406 A | 1/1996 | Shi | | 5,670,800 A | 9/1997 | Nakao et al. |
| 5,491,461 A | 2/1996 | Partin et al. | | 5,674,366 A | 10/1997 | Hayashi et al. |
| 5,492,859 A | 2/1996 | Sakaguchi et al. | | 5,674,813 A | 10/1997 | Nakamura et al. |
| 5,494,711 A | 2/1996 | Takeda et al. | | 5,679,947 A | 10/1997 | Doi et al. |
| 5,504,035 A | 4/1996 | Rostoker et al. | | 5,679,965 A | 10/1997 | Schetzina |
| 5,504,183 A | 4/1996 | Shi | | 5,682,046 A | 10/1997 | Takahashi et al. |
| 5,508,554 A | 4/1996 | Takatani et al. | | 5,684,302 A | 11/1997 | Wersing et al. |
| 5,510,665 A | 4/1996 | Conley | | 5,686,741 A | 11/1997 | Ohori et al. |
| 5,511,238 A | 4/1996 | Bayraktaroglu | | 5,689,123 A | 11/1997 | Major et al. |
| 5,512,773 A | 4/1996 | Wolf et al. | | 5,693,140 A | 12/1997 | McKee et al. |
| 5,514,484 A | 5/1996 | Nashimoto | | 5,696,392 A | 12/1997 | Char et al. |
| 5,514,904 A | 5/1996 | Onga et al. | | 5,719,417 A | 2/1998 | Roeder et al. |
| 5,515,047 A | 5/1996 | Yamakido et al. | | 5,725,641 A | 3/1998 | MacLeod |
| 5,515,810 A | 5/1996 | Yamashita et al. | | 5,729,394 A | 3/1998 | Sevier et al. |
| 5,516,725 A | 5/1996 | Chang et al. | | 5,729,641 A | 3/1998 | Chandonnet et al. |
| 5,519,235 A | 5/1996 | Ramesh | | 5,731,220 A | 3/1998 | Tsu et al. |
| 5,523,602 A | 6/1996 | Horiuchi et al. | | 5,733,641 A | 3/1998 | Fork et al. |
| 5,528,057 A | 6/1996 | Yanagase et al. | | 5,734,672 A | 3/1998 | McMinn et al. |
| 5,528,067 A | 6/1996 | Farb et al. | | 5,735,949 A | 4/1998 | Mantl et al. |
| 5,528,209 A | 6/1996 | Macdonald et al. | | 5,741,724 A | 4/1998 | Ramdani et al. |
| 5,528,414 A | 6/1996 | Oakley | | 5,745,631 A | 4/1998 | Reinker |
| 5,530,235 A | 6/1996 | Stefik et al. | | 5,753,300 A | 5/1998 | Wessels et al. |
| 5,538,941 A | 7/1996 | Findikoglu et al. | | 5,753,928 A | 5/1998 | Krause |

| | | | | | |
|---|---|---|---|---|---|
| 5,753,934 A | 5/1998 | Yano et al. | 5,948,161 A | 9/1999 | Kizuki |
| 5,754,319 A | 5/1998 | Van De Voorde et al. | 5,953,468 A | 9/1999 | Finnila et al. |
| 5,754,714 A | 5/1998 | Suzuki et al. | 5,955,591 A | 9/1999 | Imbach et al. |
| 5,760,426 A | 6/1998 | Marx et al. | 5,959,308 A | 9/1999 | Shichijo et al. |
| 5,760,427 A | 6/1998 | Onda | 5,959,879 A | 9/1999 | Koo |
| 5,760,740 A | 6/1998 | Blodgett | 5,962,069 A | 10/1999 | Schindler et al. |
| 5,764,676 A | 6/1998 | Paoli et al. | 5,963,291 A | 10/1999 | Wu et al. |
| 5,767,543 A | 6/1998 | Ooms et al. | 5,966,323 A | 10/1999 | Chen et al. |
| 5,770,887 A | 6/1998 | Tadatomo et al. | 5,976,953 A | 11/1999 | Zavracky et al. |
| 5,772,758 A | 6/1998 | Collins et al. | 5,977,567 A | 11/1999 | Verdiell |
| 5,776,359 A | 7/1998 | Schultz et al. | 5,981,400 A | 11/1999 | Lo |
| 5,776,621 A | 7/1998 | Nashimoto | 5,981,976 A | 11/1999 | Murasato |
| 5,777,350 A | 7/1998 | Nakamura et al. | 5,981,980 A | 11/1999 | Miyajima et al. |
| 5,777,762 A | 7/1998 | Yamamoto | 5,984,190 A | 11/1999 | Nevill |
| 5,778,018 A | 7/1998 | Yoshikawa et al. | 5,985,404 A | 11/1999 | Yano et al. |
| 5,778,116 A | 7/1998 | Tomich | 5,986,301 A | 11/1999 | Fukushima et al. |
| 5,780,311 A | 7/1998 | Beasom et al. | 5,987,011 A | 11/1999 | Toh |
| 5,789,733 A | 8/1998 | Jachimowicz et al. | 5,987,196 A | 11/1999 | Noble |
| 5,789,845 A | 8/1998 | Wadaka et al. | 5,990,495 A | 11/1999 | Ohba |
| 5,790,583 A | 8/1998 | Ho | 5,995,359 A | 11/1999 | Klee et al. |
| 5,792,569 A | 8/1998 | Sun et al. | 5,995,528 A | 11/1999 | Fukunaga et al. |
| 5,792,679 A | 8/1998 | Nakato | 5,997,638 A | 12/1999 | Copel et al. |
| 5,796,648 A | 8/1998 | Kawakubo et al. | 5,998,781 A | 12/1999 | Vawter et al. |
| 5,801,072 A | 9/1998 | Barber | 5,998,819 A | 12/1999 | Yokoyama et al. |
| 5,801,105 A | 9/1998 | Yano et al. | 6,002,375 A | 12/1999 | Corman et al. |
| 5,807,440 A | 9/1998 | Kubota et al. | 6,008,762 A | 12/1999 | Nghiem |
| 5,810,923 A | 9/1998 | Yano et al. | 6,011,641 A | 1/2000 | Shin et al. |
| 5,812,272 A | 9/1998 | King et al. | 6,011,646 A | 1/2000 | Mirkarimi et al. |
| 5,814,583 A | 9/1998 | Itozaki et al. | 6,013,553 A | 1/2000 | Wallace et al. |
| 5,825,055 A | 10/1998 | Summerfelt | 6,020,222 A | 2/2000 | Wollesen |
| 5,825,799 A | 10/1998 | Ho et al. | 6,022,140 A | 2/2000 | Fraden et al. |
| 5,827,755 A | 10/1998 | Yonehara et al. | 6,022,410 A | 2/2000 | Yu et al. |
| 5,828,080 A | 10/1998 | Yano et al. | 6,022,671 A | 2/2000 | Binkley et al. |
| 5,830,270 A | 11/1998 | McKee et al. | 6,022,963 A | 2/2000 | McGall et al. |
| 5,831,960 A | 11/1998 | Jiang et al. | 6,023,082 A | 2/2000 | McKee et al. |
| 5,833,603 A | 11/1998 | Kovacs et al. | 6,028,853 A | 2/2000 | Haartsen |
| 5,834,362 A | 11/1998 | Miyagaki et al. | 6,039,803 A | 3/2000 | Fitzgerald et al. |
| 5,838,035 A | 11/1998 | Ramesh | 6,045,626 A | 4/2000 | Yano et al. |
| 5,838,053 A | 11/1998 | Bevan et al. | 6,046,464 A | 4/2000 | Schetzina |
| 5,844,260 A | 12/1998 | Ohori | 6,048,751 A | 4/2000 | D'Asaro et al. |
| 5,846,846 A | 12/1998 | Suh et al. | 6,049,110 A | 4/2000 | Koh |
| 5,852,687 A | 12/1998 | Wickham | 6,049,702 A | 4/2000 | Tham et al. |
| 5,857,049 A | 1/1999 | Beranek et al. | 6,051,858 A | 4/2000 | Uchida et al. |
| 5,858,814 A | 1/1999 | Goossen et al. | 6,051,874 A | 4/2000 | Masuda |
| 5,861,966 A | 1/1999 | Ortel | 6,055,179 A | 4/2000 | Koganei et al. |
| 5,863,326 A | 1/1999 | Nause et al. | 6,058,131 A | 5/2000 | Pan |
| 5,864,171 A | 1/1999 | Yamamoto et al. | 6,059,895 A | 5/2000 | Chu et al. |
| 5,869,845 A | 2/1999 | Vander Wagt et al. | 6,064,078 A | 5/2000 | Northrup et al. |
| 5,872,493 A | 2/1999 | Ella | 6,064,092 A | 5/2000 | Park |
| 5,873,977 A | 2/1999 | Desu et al. | 6,064,783 A | 5/2000 | Congdon et al. |
| 5,874,860 A | 2/1999 | Brunel et al. | 6,078,717 A | 6/2000 | Nashimoto et al. |
| 5,878,175 A | 3/1999 | Sonoda et al. | 6,080,378 A | 6/2000 | Yokota et al. |
| 5,879,956 A | 3/1999 | Seon et al. | 6,083,697 A | 7/2000 | Beecher et al. |
| 5,880,452 A | 3/1999 | Plesko | 6,087,681 A | 7/2000 | Shakuda |
| 5,882,948 A | 3/1999 | Jewell | 6,088,216 A | 7/2000 | Laibowitz et al. |
| 5,883,564 A | 3/1999 | Partin | 6,090,659 A | 7/2000 | Laibowitz et al. |
| 5,883,996 A | 3/1999 | Knapp et al. | 6,093,302 A | 7/2000 | Montgomery |
| 5,886,867 A | 3/1999 | Chivukula et al. | 6,096,584 A | 8/2000 | Ellis-Monaghan et al. |
| 5,888,296 A | 3/1999 | Ooms et al. | 6,100,578 A | 8/2000 | Suzuki |
| 5,889,296 A | 3/1999 | Imamura et al. | 6,103,008 A | 8/2000 | McKee et al. |
| 5,896,476 A | 4/1999 | Wisseman et al. | 6,103,403 A | 8/2000 | Grigorian et al. |
| 5,905,571 A | 5/1999 | Butler et al. | 6,107,653 A | 8/2000 | Fitzgerald |
| 5,907,792 A | 5/1999 | Droopad et al. | 6,107,721 A | 8/2000 | Lakin |
| 5,912,068 A | 6/1999 | Jia | 6,108,125 A | 8/2000 | Yano |
| 5,919,515 A | 7/1999 | Yano et al. | 6,110,813 A | 8/2000 | Ota et al. |
| 5,919,522 A | 7/1999 | Baum et al. | 6,110,840 A | 8/2000 | Yu |
| 5,926,493 A | 7/1999 | O'Brien et al. | 6,113,225 A | 9/2000 | Miyata et al. |
| 5,926,496 A | 7/1999 | Ho et al. | 6,113,690 A | 9/2000 | Yu et al. |
| 5,937,115 A | 8/1999 | Domash | 6,114,996 A | 9/2000 | Nghiem |
| 5,937,274 A | 8/1999 | Kondow et al. | 6,121,642 A | 9/2000 | Newns |
| 5,937,285 A | 8/1999 | Abrokwah et al. | 6,121,647 A | 9/2000 | Yano et al. |

| Patent No. | Date | Inventor(s) |
|---|---|---|
| 6,128,178 A | 10/2000 | Newns |
| 6,134,114 A | 10/2000 | Ungermann et al. |
| 6,136,666 A | 10/2000 | So |
| 6,137,603 A | 10/2000 | Henmi |
| 6,139,483 A | 10/2000 | Seabaugh et al. |
| 6,140,746 A | 10/2000 | Miyashita et al. |
| 6,143,072 A | 11/2000 | McKee et al. |
| 6,143,366 A | 11/2000 | Lu |
| 6,146,906 A | 11/2000 | Inoue et al. |
| 6,150,239 A | 11/2000 | Goesele et al. |
| 6,151,240 A | 11/2000 | Suzuki |
| 6,153,010 A | 11/2000 | Kiyoku et al. |
| 6,153,454 A | 11/2000 | Krivokapic |
| 6,156,581 A | 12/2000 | Vaudo et al. |
| 6,173,474 B1 | 1/2001 | Conrad |
| 6,174,755 B1 | 1/2001 | Manning |
| 6,175,497 B1 | 1/2001 | Tseng et al. |
| 6,175,555 B1 | 1/2001 | Hoole |
| 6,180,252 B1 | 1/2001 | Farrell et al. |
| 6,180,486 B1 | 1/2001 | Leobandung et al. |
| 6,181,920 B1 | 1/2001 | Dent et al. |
| 6,184,044 B1 | 2/2001 | Sone et al. |
| 6,184,144 B1 | 2/2001 | Lo |
| 6,191,011 B1 | 2/2001 | Gilboa et al. |
| 6,194,753 B1 | 2/2001 | Seon et al. |
| 6,197,503 B1 | 3/2001 | Vo-Dinh et al. |
| 6,198,119 B1 | 3/2001 | Nabatame et al. |
| 6,204,525 B1 | 3/2001 | Sakurai et al. |
| 6,204,737 B1 | 3/2001 | Ella |
| 6,208,453 B1 | 3/2001 | Wessels et al. |
| 6,210,988 B1 | 4/2001 | Howe et al. |
| 6,211,096 B1 | 4/2001 | Allman et al. |
| 6,222,654 B1 | 4/2001 | Frigo |
| 6,224,669 B1 | 5/2001 | Yi et al. |
| 6,225,051 B1 | 5/2001 | Sugiyama et al. |
| 6,229,159 B1 | 5/2001 | Suzuki |
| 6,232,242 B1 | 5/2001 | Hata et al. |
| 6,232,806 B1 | 5/2001 | Woeste et al. |
| 6,232,910 B1 | 5/2001 | Bell et al. |
| 6,233,435 B1 | 5/2001 | Wong |
| 6,235,145 B1 | 5/2001 | Li et al. |
| 6,235,649 B1 | 5/2001 | Kawahara et al. |
| 6,238,946 B1 | 5/2001 | Ziegler |
| 6,239,012 B1 | 5/2001 | Kinsman |
| 6,239,449 B1 | 5/2001 | Fafard et al. |
| 6,241,821 B1 | 6/2001 | Yu et al. |
| 6,242,686 B1 | 6/2001 | Kishimoto et al. |
| 6,248,459 B1 | 6/2001 | Wang et al. |
| 6,248,621 B1 | 6/2001 | Wilk et al. |
| 6,252,261 B1 | 6/2001 | Usui et al. |
| 6,255,198 B1 | 7/2001 | Linthicum et al. |
| 6,256,426 B1 | 7/2001 | Duchet |
| 6,265,749 B1 | 7/2001 | Gardner et al. |
| 6,268,269 B1 | 7/2001 | Lee et al. |
| 6,271,619 B1 | 8/2001 | Yamada et al. |
| 6,275,122 B1 | 8/2001 | Speidell et al. |
| 6,277,436 B1 | 8/2001 | Stauf et al. |
| 6,278,137 B1 | 8/2001 | Shimoyama et al. |
| 6,278,138 B1 | 8/2001 | Suzuki |
| 6,278,523 B1 | 8/2001 | Gorecki |
| 6,278,541 B1 | 8/2001 | Baker |
| 6,291,319 B1 | 9/2001 | Yu et al. |
| 6,291,866 B1 | 9/2001 | Wallace |
| 6,297,598 B1 | 10/2001 | Wang et al. |
| 6,297,842 B1 | 10/2001 | Koizumi et al. |
| 6,300,615 B1 | 10/2001 | Shinohara et al. |
| 6,306,668 B1 | 10/2001 | McKee et al. |
| 6,307,996 B1 | 10/2001 | Nashimoto et al. |
| 6,312,819 B1 | 11/2001 | Jia et al. |
| 6,313,486 B1 | 11/2001 | Kencke et al. |
| 6,316,785 B1 | 11/2001 | Nunoue et al. |
| 6,316,832 B1 | 11/2001 | Tsuzuki et al. |
| 6,319,730 B1 | 11/2001 | Ramdani et al. |
| 6,320,238 B1 | 11/2001 | Kizilyalli et al. |
| 6,326,637 B1 | 12/2001 | Parkin et al. |
| 6,326,645 B1 | 12/2001 | Kadota |
| 6,326,667 B1 | 12/2001 | Sugiyama et al. |
| 6,329,277 B1 | 12/2001 | Liu et al. |
| 6,338,756 B2 | 1/2002 | Dietze |
| 6,339,664 B1 | 1/2002 | Farjady et al. |
| 6,340,788 B1 | 1/2002 | King et al. |
| 6,341,851 B1 | 1/2002 | Takayama et al. |
| 6,343,171 B1 | 1/2002 | Yoshimura et al. |
| 6,345,424 B1 | 2/2002 | Hasegawa et al. |
| 6,348,373 B1 | 2/2002 | Ma et al. |
| 6,355,945 B1 | 3/2002 | Kadota et al. |
| 6,359,330 B1 | 3/2002 | Goudard |
| 6,362,017 B1 | 3/2002 | Manabe et al. |
| 6,362,558 B1 | 3/2002 | Fukui |
| 6,367,699 B2 | 4/2002 | Ackley |
| 6,372,356 B1 | 4/2002 | Thornton et al. |
| 6,372,813 B1 | 4/2002 | Johnson et al. |
| 6,376,337 B1 | 4/2002 | Wang et al. |
| 6,389,209 B1 | 5/2002 | Suhir |
| 6,391,674 B2 | 5/2002 | Ziegler |
| 6,392,253 B1 | 5/2002 | Saxena |
| 6,392,257 B1 | 5/2002 | Ramdani et al. |
| 6,393,167 B1 | 5/2002 | Davis et al. |
| 6,404,027 B1 | 6/2002 | Hong et al. |
| 6,410,941 B1 | 6/2002 | Taylor et al. |
| 6,410,947 B1 | 6/2002 | Wada |
| 6,411,756 B2 | 6/2002 | Sadot et al. |
| 6,415,140 B1 | 7/2002 | Benjamin et al. |
| 6,417,059 B2 | 7/2002 | Huang |
| 6,419,849 B1 | 7/2002 | Qiu et al. |
| 6,427,066 B1 | 7/2002 | Grube |
| 6,432,546 B1 | 8/2002 | Ramesh et al. |
| 6,438,281 B1 | 8/2002 | Tsukamoto et al. |
| 6,445,724 B2 | 9/2002 | Abeles |
| 6,452,232 B1 | 9/2002 | Adan |
| 6,461,927 B1 | 10/2002 | Mochizuki et al. |
| 6,462,360 B1 | 10/2002 | Higgins, Jr. et al. |
| 6,477,285 B1 | 11/2002 | Shanley |
| 6,496,469 B1 | 12/2002 | Uchizaki |
| 6,498,358 B1 | 12/2002 | Lach et al. |
| 6,501,121 B1 | 12/2002 | Yu et al. |
| 6,504,189 B1 | 1/2003 | Matsuda et al. |
| 6,524,651 B2 | 2/2003 | Gan et al. |
| 6,528,374 B2 | 3/2003 | Bojarczuk, Jr. et al. |
| 6,538,359 B1 | 3/2003 | Hiraku et al. |
| 6,589,887 B1 | 7/2003 | Dalton et al. |
| 2001/0013313 A1 | 8/2001 | Droopad et al. |
| 2001/0020278 A1 | 9/2001 | Saito |
| 2001/0036142 A1 | 11/2001 | Kadowaki et al. |
| 2001/0055820 A1 | 12/2001 | Sakurai et al. |
| 2002/0006245 A1 | 1/2002 | Kubota et al. |
| 2002/0008234 A1 | 1/2002 | Emrick |
| 2002/0021855 A1 | 2/2002 | Kim |
| 2002/0030246 A1 | 3/2002 | Eisenbeiser et al. |
| 2002/0047123 A1 | 4/2002 | Ramdani et al. |
| 2002/0047143 A1 | 4/2002 | Ramdani et al. |
| 2002/0052061 A1 | 5/2002 | Fitzgerald |
| 2002/0072245 A1 | 6/2002 | Ooms et al. |
| 2002/0076878 A1 | 6/2002 | Wasa et al. |
| 2002/0079576 A1 | 6/2002 | Seshan |
| 2002/0131675 A1 | 9/2002 | Litvin |
| 2002/0140012 A1 | 10/2002 | Droopad |
| 2002/0145168 A1 | 10/2002 | Bojarczuk, Jr. et al. |
| 2002/0179000 A1 | 12/2002 | Lee et al. |
| 2002/0195610 A1 | 12/2002 | Klosowiak |

FOREIGN PATENT DOCUMENTS

| | | |
|---|---|---|
| EP | 0 494 514 | 7/1992 |
| EP | 0 514 018 | 11/1992 |
| EP | 0 538 611 | 4/1993 |
| EP | 0 581 239 | 2/1994 |
| EP | 0 600 658 | 6/1994 |
| EP | 0 602 568 | 6/1994 |
| EP | 0 607 435 | 7/1994 |
| EP | 0 614 256 | 9/1994 |
| EP | 0 619 283 | 10/1994 |
| EP | 0 630 057 | 12/1994 |
| EP | 0 661 561 | 7/1995 |
| EP | 0 860 913 | 8/1995 |
| EP | 0 682 266 | 11/1995 |
| EP | 0 711 853 | 5/1996 |
| EP | 0 766 292 | 4/1997 |
| EP | 0 777 379 | 6/1997 |
| EP | 0 810 666 | 12/1997 |
| EP | 0 828 287 | 3/1998 |
| EP | 0 852 416 | 7/1998 |
| EP | 0 875 922 | 11/1998 |
| EP | 0 881 669 | 12/1998 |
| EP | 0 884 767 | 12/1998 |
| EP | 0 926 739 | 6/1999 |
| EP | 0 957 522 | 11/1999 |
| EP | 0 964 259 | 12/1999 |
| EP | 0 964 453 | 12/1999 |
| EP | 0 993 027 | 4/2000 |
| EP | 0 999 600 | 5/2000 |
| EP | 1 001 468 | 5/2000 |
| EP | 1 035 759 | 9/2000 |
| EP | 1 037 272 | 9/2000 |
| EP | 1 043 426 | 10/2000 |
| EP | 1 043 427 | 10/2000 |
| EP | 1 043 765 | 10/2000 |
| EP | 1 054 442 | 11/2000 |
| EP | 1 069 605 | 1/2001 |
| EP | 1 069 606 | 1/2001 |
| EP | 1 085 319 | 3/2001 |
| EP | 1 089 338 | 4/2001 |
| EP | 1 109 212 | 6/2001 |
| EP | 1 176 230 | 1/2002 |
| FR | 2 779 843 | 12/1999 |
| GB | 1 319 311 | 6/1970 |
| GB | 2 152 315 | 7/1985 |
| GB | 2 335 792 | 9/1999 |
| JP | 52-88354 | 7/1977 |
| JP | 52-89070 | 7/1977 |
| JP | 52-135684 | 11/1977 |
| JP | 54-134554 | 10/1979 |
| JP | 55-87424 | 7/1980 |
| JP | 58-075868 | 5/1983 |
| JP | 58-213412 | 12/1983 |
| JP | 59-044004 | 3/1984 |
| JP | 59066183 | 4/1984 |
| JP | 59-073498 | 4/1984 |
| JP | 60-161635 | 8/1985 |
| JP | 60-210018 | 10/1985 |
| JP | 60-212018 | 10/1985 |
| JP | 61-36981 | 2/1986 |
| JP | 61-63015 | 4/1986 |
| JP | 61-108187 | 5/1986 |
| JP | 62-245205 | 10/1987 |
| JP | 63-34994 | 2/1988 |
| JP | 63-131104 | 6/1988 |
| JP | 63-198365 | 8/1988 |
| JP | 63-289812 | 11/1988 |
| JP | 64-50575 | 2/1989 |
| JP | 64-52329 | 2/1989 |
| JP | 1-102435 | 4/1989 |
| JP | 1-179411 | 7/1989 |
| JP | 01-196809 | 8/1989 |
| JP | 03-149882 | 11/1989 |
| JP | HEI 2-391 | 1/1990 |
| JP | 02051220 | 2/1990 |
| JP | 3-41783 | 2/1991 |
| JP | 03046384 | 2/1991 |
| JP | 3-171617 | 7/1991 |
| JP | 03-188619 | 8/1991 |
| JP | 5-48072 | 2/1993 |
| JP | 5-086477 | 4/1993 |
| JP | 05150143 | 6/1993 |
| JP | 5-152529 | 6/1993 |
| JP | 05 221800 | 8/1993 |
| JP | 5-232307 | 9/1993 |
| JP | 5-238894 | 9/1993 |
| JP | 5-243525 | 9/1993 |
| JP | 5-291299 | 11/1993 |
| JP | 06-069490 | 3/1994 |
| JP | 6-232126 | 8/1994 |
| JP | 6-291299 | 10/1994 |
| JP | 6-334168 | 12/1994 |
| JP | 0812494 | 1/1996 |
| JP | 9-67193 | 3/1997 |
| JP | 9-82913 | 3/1997 |
| JP | 10-256154 | 9/1998 |
| JP | 10-269842 | 10/1998 |
| JP | 10-303396 | 11/1998 |
| JP | 10-321943 | 12/1998 |
| JP | 11135614 | 5/1999 |
| JP | 11-238683 | 8/1999 |
| JP | 11-260835 | 9/1999 |
| JP | 01 294594 | 11/1999 |
| JP | 11340542 | 12/1999 |
| JP | 2000-068466 | 3/2000 |
| JP | 2 000 1645 | 6/2000 |
| JP | 2000-278085 | 10/2000 |
| JP | 2000-349278 | 12/2000 |
| JP | 2000-351692 | 12/2000 |
| JP | 2001-196892 | 7/2001 |
| JP | 2002-9366 | 1/2002 |
| WO | WO 92/10875 | 6/1992 |
| WO | WO 93/07647 | 4/1993 |
| WO | WO 94/03908 | 2/1994 |
| WO | WO 95/02904 | 1/1995 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | WO 99/14804 | 3/1999 |
| WO | WO 99/19546 | 4/1999 |
| WO | WO 99/63580 | 12/1999 |
| WO | WO 99/67882 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/04943 A1 | 1/2001 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 01/59837 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/08806 | 1/2002 |
| WO | WO 02/09160 A2 | 1/2002 |
| WO | WO 02/009150 | 1/2002 |

| | | |
|---|---|---|
| WO | WO 02/11254 | 2/2002 |
| WO | WO 02/33385 A2 | 4/2002 |
| WO | WO 02/47127 A2 | 6/2002 |
| WO | WO 02/50879 | 6/2002 |
| WO | WO 02/099885 | 12/2002 |
| WO | WO 03/012874 | 2/2003 |

OTHER PUBLICATIONS

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth ad Properties of Ferromagnetic Co–Doped TiO2 Anatase"; Applied Physics Letters; vol. 79, No. 21; Nov. 19, 2001; pp. 3467–3469.

Peter Weiss; "Speed demon gets hooked on silicon"; Science News Online; Sep. 15, 2001; pp. 1–3.

"Motorola Develops New Super–Fast Chip"; USA Today; Sep. 4, 2001.

Lori Valigra; "Motorola Lays GaAs on SI Wafer"; AsiaBizTech; Nov. 2001pp.1–3.

"Holy Graill Motorola Claims High–Yield GaAs Breakthrough"; Micromagazine.com (no date available); pp. 1–3.

Jong–Gul Yoon; "Growth of Ferroelectric LiNbO3 Thin Film on MgO–Buffered Si by the Sol–Gel Method"; Journal of the Korean Physical Society (Proc. Suppl.); vol. 29, Nov. 1996; pp. S648–S651.

V. Bornand et al.; "Deposition of LITaO3 thin films by pyrosol process"; Thin Solid Films 304 (1997); pp. 239–244.

R. Droopad et al.; "Development of high dielectric constant epitaxial oxides on silicon by molecular beam epitaxy"; Materials Science and Engineering B87 (2001); pp. 292–296.

A.K. Sharma et al.; "Integration of Pb(Zr0.52Ti0.48)O3 epilayers with Si by domain epitaxy"; Applied Physics Letters, vol. 76, No. 11; Mar. 13, 2000; pp. 1458–1460.

Dwight C. Streit et al; "High Reliability GaAs–AlGaAs HBT's by MBE with Be Base Doping and InGaAs Emitter Contacts"; 8179 Ieee Electron Device Letters; Sep. 12, (1991), No. 9, New York, US.

C. Y. Hung et al; "Piezoelectrically induced stress tuning of electro–optic devices"; 320 Applied Physics Letters; 59 Dec. 30, (1991), No. 27 New York, US.

J. Piprek; "Heat Flow Analysis of Long–Wvelength VCSELs with Various DBR Materials"; University of Delaware, Materials Science, Newark, DE, 19716–3106; Oct. 31, 1994; pp. 286–287.

P. Mackowiak et al.; "Some aspects of designing an efficient nitride VCSEL resonator"; J Phys. D; Appl. Phys. 34(2001); pp. 954–958.

M.R. Wilson et al.; GaAs–On–SI: A GaAs IC Manufacturer's Perspective; GaAs IC Symposium, IEEE, 1988; pp. 243–246.

Y. Kitano et al.; "Thin film crystal growth of BaZrO3 at low oxygen partial pressure"; Journal of Crystal Growth 243 (2002); pp. 164–169.

M.E. Hawley; et al; "Microstructural Study of Colossal Magneto–Resistive Films As a Function of Growth Temperature, As Deposited and Annealed"; 401, 1996; pp. 531–536.

Yi W. et al; "Mechanism of cleaning Si (100) surface using Sr and SrO for the growth of crystalline SrTlO/sub 2/films" Journal of Vacuum Science & Technology, vol. 20, No. 4, Jul. 2002 pp. 1402–1405.

Xiaming Hu et al; "Sr/Si template formation for the epitaxial growth of SrTiO/sub 3/on silicon" Materials Research Society Proceedings, vol. 716, 2002, pp. 261–268.

Charles Kittel; "Introduction to Solid State Physics"; John Wiley & Sons, Inc. Fifth Edition; pp. 415.

Chyuan–Wei Chen et al; "Liquid–phase epitaxial growth and characterization of InGaAsP layers grown on GaAsP substrates for application to orange light–emitting diodes"; 931 Journal of Applied Physics; 77 Jan. 15, (1995), No. 2; Woodbury, NY, US: pp. 905–909.

W. Zhu et al. ; "Oriented dismond films grown on nickel substrates"; 320 Applied Physics Letters; 63 Sep. (1993), No. 12, Woodbury, NY, US; pp. 1640–1642.

M. Schreck et al. ; "Diamond/Ir/SrTiO3: A material combination for improved heteroepitaxial diamond films"; Applied Physics Letters; vol. 74, No. 5; Feb. 1, 1999; pp. 650–652.

Yoshihiro Yokota et al. ; "Cathodoluminescence of boron–doped heteroepitaxial diamond films on platinum"; Diamond and Related Materials 8(1999) ; pp. 1587–1591.

J. R. Busch et al. ; "Linear Electro–Optic Response in SOL–GEL PZT Planar Waveguide" ; Electronics Letters; Aug. 13th, 1992; vol. 28, No. 17; pp. 1591–1592.

R. Droopad et al; "Epitaxial Oxide Films on Silicon: Growth, Modeling and Device Properties"; Mat. Res. Soc. Symp. Proc. vol. 619; 2000 Materials Research Society; pp. 155–165.

H. Ohkubo et al. ; "Fabrication of High Quality Perovskite Oxide Films by Lateral Epitaxy Verified with RHEED Oscillation" ; 2419A Int. Conf. on Solid State Devices & Materials, Tsukuba, Aug. 26–28, (1992) ; pp. 457–459.

Lin Li; "Ferroelectric/Superconductor Heterostructures" ; Materials Science and Engineering; 29 (2000) pp. 153–181.

L. Fan et al. ; "Dynaamic Beam Switching of Vertical–Cavitiy Surface–Emitting Lasers with Integrated Optical Beam Routers" ; IEEE Photonics Technology Letters; vol. 9, No. 4; Apr. 4, 1997; pp. 505–507.

Y. Q. Xu. et al. ; "(Mn, Sb) dropped–Pb(Zr, Ti)03 infrared detector arrays" ; Journal of Applied Physics; vol. 88, No. 2; Jul. 15, 2000; pp. 1004–1007.

Kiyoko Kato et al. ; "Reduction of disclocations in InGaAs layer on GaAs using epitaxial lateral overgrowth" ; 2300 Journal of Crystal Growth 115 (1991) pp. 174–179; Dec. 1991.

Nakagawara et al., Effects of Buffer Layers in Epitaxial Growth of SrTiO$_3$ Thin Film on Si(100), *J. Appl. Phys.,* 78 (12), Dec. 15, 1995, pp. 7226–7230.

Suzuki et al., "A Proposal of Epitaxial Oxide Thin Film Structures For Future Oxide Electronics," *Materials Science and Engineering B41,* (1996), pp. 166–173.

W. F. Egelhoff et al., "Optimizing GMR Spin Valves: The Outlook for Improved Properties", *1998 Int'l Non Volatile Memory Technology Conference,* pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in GaAs/LiNbO$_3$ Structures", *Applied Physics Letters,* vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," *1997 Applied Physics Letters*, vol. 70(16), Apr. 21, 1997, pp. 2097–2099.

A. Mansingh et al., "Surface Acoustic Wave Propagation in PZT/YBCO/SrTIO$_3$ and PbTIO$_3$/YBCO/SrTIO$_3$ Epitaxial Heterostructures," *Ferroelectric*, vol. 224, pp. 275–282, 1999.

S. Matthews et al., "Ferroelectric Field Effect Transistor Based on Epitaxial Perovskite Heterostructures", Science, vol. 276, Apr. 11, 1997, pp. 238–240.

R. Houdre et al., "Properties of GaAs in Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884–1886.

Ringel et al., "Epitaxial Integration of III–V Materials and Devices with Si Using Grade GeSi Buffers," 27th International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100)MgO/(100) GaAs Interface," *Appl. Phys Lett.* 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La$_{0.07}$Sr$_{0.33}$MnO$_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO–AI$_2$O$_3$Epi./SiO$_3$/Si and Its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of CaF$_2$ and Silicon," *Thin Solid Films*, vol. 93 (1982), pp. 143–150.

T. Chikyow et al., "Reaction and Regrowth Control of CeO$_2$ on Si(111) Surface for the Silicon–On–Insulator Structure," *Appl. Phys. Lett.*, vol. 65, No. 8, Aug. 22, 1994, pp. 1030–1032.

J.F. Kang, et al., "Epitaxial Growth of CeO$_2$(100) Films on Si(100) Substrates by Dual Ion Beams Reactive Sputtering," *Solid State Communications*, vol. 108, No. 4, pp. 225–227, 1996.

R.A. Morgan et al., "Vertical–Cavity Surface–Emitting Lasers Come of Age," *SPIE*, vol. 2683, pp. 18–29.

"Technical Analysis of Qualcomm QCR–800 Portable Cellular Phone (Transmitter Circuitry), " Talus Corporation, Qualcomm QCP–800 Technical Analysis Report, Dec. 10, 1996, pp. 5–8.

Jo–Ey Wong, et al.; "An Electrostatically–Actuated Mems Switch for Power Applications"; IEEE, 2000; pp. 633–638.

T. Mizuno, et al.; "Electron and Hole Mobility Enhancement in Strained–Si MOSFET's on SiGe–on–Insulator Substrates Fabricated by SIMOX Technology"; IEEE Electron Device Letters, vol. 21. No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7th Int'l Workshop on, 2000; pp. 64–65.

S.S. Lu, et al.; "Piezoelectric field effect transistor (PEFET) using In$_{0.2}$Ga$_{0.8}$As/Al$_{0.35}$As/In$_{0.2}$Ga$_{0.8}$As/GaAs Strained layer structure on (111)B GaAs substrate"; Electronic Letters, 12TH Ma 1994, vol. 30, No. 10; pp. 823–825.

Kihong Kim, et al." On–Chip Wireless Inter/connection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al.; "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process"; GaAs IC Symposium, IEEE, 1993, pp. 127–130.

H. Nagata, "A Preliminary Consideration of the Growth Behaviour of CeO$_2$, SrTiO$_3$ and SrVO$_3$ Films on Si Substrate," *Thin Solid Films*, 224, 1993, pp.1–3.

Nagata et al., "Heteroepitaxial Growth of CeO$_2$(001) Films on Si(001) Substrates by Pulsed Laser Deposition in Ultra-high Vacuum," *Jpn. Jour. Appl. Phys.*, vol. 30, No. 6B, Jun. 1991, pp. L1136–L1138.

Kado et al., "Heteroepitaxial Growth of SrO Films on Si Substrates," *J. Appl. Phys.*, 61(6), Mar. 15, 1987, pp. 2398–2400.

H. Ishiwara et al., "Epitaxial Growth of Pervoskite Type Oxide Films on Substrates"; *Materials Research Symposium Proceedings*, vol. 220, pp. 595–600, Apr. 29 –May 3, 1991.

J.K. Abrokwah, et al.; "A Manufacturable High–Speed Low– Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993, pp. 67–150.

Jayshri Sabarinathat, et al.; "Submicron three-dimensional infrared GaAs/Al$_x$O$_y$-based photonic crystal using single-step epitaxial growth"; Applied Physics Letters, vol. 78, No. 20, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6. Jun. 2000; pp. 807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Shichijo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE; GaAs IC Symposium 239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al.; "Metamorphic InAiAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Arnold Leitner et al; "Pulsed Laser Deposition of Superconducting Strontium Titanate Thin–Films"; ; Session K11–Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AIN films on –AI$_2$O$_3$, Si and 6H–SiC by pulsed laser deposition"; Thin Solid Films 299 (1997), pp. 94–103.

T. Warren Weeks, et al.; "GaN thin films deposited via organometallic vapor phase epitaxy on (6H)–SiC(0001) using high–temperature monocrystalline AIN buffer layers" 320 Applied Physics Letters, vol. 67, No. 3, Jul. 17, 1995, pp|401–403.

Z. Yu, et al.; "Epitaxial oxide thin films on SI(001)"; J. Vac. Sci. Technol. B. vol. 18, No. 4, Jul./Aug. 2000; pp. 2139–2145.

Gentex Corporate Website; Photoelectric Smoke Detectors—How They Work; 2001.

Jeffrey B. Casady, et al.; "A Hybrid 6H–SiC Temperature Sensor Operational from 25 C to 500 C"; IEEE Transactions on Components, Packaging, and Manufacturing Technology—Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "A single–chip linear optical amplifier"; OFC, Mar. 17–22, 2001.

G. Vogg et al.; "Epitaxial alloy films of zintt–phase Ca(Si1–xGex)2"; Journal of Crystal Growth 223 (2001); pp 573–576.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinal Buffer Layer", IBM Technical Bulletin, vol. 30, No. 6, Nov. 1987, p. 365.

"GaInAs Superconducting FET," IBM Technical Bulletin, vol. 36, No. 8, Aug. 1993, p. 655–656.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.,* vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology,* May/Jun. 1995, vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters,* vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics,* pp. 782–784, Aug. 13, 1991.

Tambo et al., Molecular Beam Epitaxy Growth of SrTiO$_3$ Films on SI(100)–2x1 with SrO Buffer Layers, *Jpn. J. Appl. Phys.,* vol. 37, 1998, pp. 4454–4459.

McKee et al., "The MBE Growth and Optical Quality of BaTiO$_3$ and SrTiO$_3$ Thin Films on MgO," *Mat. Res. Soc. Symp. Proc.,* vol. 341, Apr. 1994, pp. 309–314.

McKee et al., "BaSi$_2$ and Thin Film Alkaline Earth Silicides on Silicon," *Appl. Phys. Lett.,* 63 (20), Nov. 1993, pp. 2818–2820.

McKee et al., "Surface Structures and the Orthorhombic Transformation of Thin Film BaSi$_2$ on Silicon," *Mat. Res. Soc. Symp. Proc.,* vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–IITC99–250.

Mori et al., "Epitaxial Growth of SrTiO$_3$ Films on Si(100) Substrates Using a Focused Electron Beam Evaporation Method," *Jpn. J. Apl. Phys.*, vol. 30, No. 8A, Aug. 1991, pp. L1415–L1417.

Moon et al., "Growth of Crystalline SrTiO$_3$ Films on Si Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29 –May 2, 1991.

Ishiwara et al., "Heteroepitaxy on Silicon: Fundamentals, Structure, and Devices," *Mat. Res. Soc.*, Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of $Er^3$–doped BaTiO$_3$ thin films"; Appl. Phys. Lett. 65 (1), Jul. 4, 1994, pp. 25–17.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59 Jul. 8, (1991) No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J.M. Daughton et al.; "Applications of Spin Dependent Transport Materials"; J. Phys. D. Appl. Phys. 32(1990) R169–R177.

Wei Zhang et al.; "Stress Effect and Enhanced Magnetoresistance in $La_{0.87}Ca_{0.33}MnO_{3-\delta}$ Films"; Physical Review, B. Condensed Matter, American Institute of Physics; vol. 58, No. 21, Part 1; Dec. 1, 1998; pp. 14143–14146.

Q.–Y. Tong et al.; "IOS–a new type of materials combination for system–on–chip preparation"; 1999 IEEE International SOI Conference, Oct. 1999; pp. 104–105.

T. Kanniainen et al.; "Growth of Dielectric 1hfo2/Ta2O5 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of BaTio$_3$ Films on Si by Pulsed Laser Deposition"; Applied Physics Letters; Mar. 13, 1995; pp. 1331–1333.

Myung Bok Lee; "Formation and Characterization of Epitaxial TiO$_2$ and BaTiO$_3$/TiO$_2$ Films on Si Substrate"; Japan Journal Applied Physics Letters; vol. 34; 1995; pp. 608–811.

Gilbert Lecarpentier et al., "High Accuracy Machine Automated Assembly for Opto Electronics"; 2000 Electronic Components and Technology Conference; pp. 1–4.

R. Ramesh; "Ferroelectric La–Sr–Co–O/Pb–Zr–Ti–O/La–Sr–Co–O Heterostructures on Silicon via Template Growth"; 320 Applied Physics Letters; 63; Dec. 27, (1993); No. 26; pp. 3592–3594.

K. Eisenbeiser, "Field Effects Transistors with SrTiO$_3$ Gate Dielectric on Si"; Applied Physics Letters; vol. 76, No. 10; Mar. 6, 2000; pp. 1324–1326.

Stephen A. Mass, "Microwave Mixers"; Second Edition; 2pp.

Douglas J. Hamilton et al.; "Basic Integrated Circuit Engineering"; pp. 2; 1975.

Takeshi Obata; "Tunneling Magnetoresistance at Up to 270 K in $La_{0.8}Sr_{0.2}MnO_3$/SrTiO$_3$$La_{0.8}Sr_{0.2}MnO_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La–Ca–Mn–O Films on Si Substrates Using YbaCuO/CaO$_2$ Heterostructures"; Physica C; vol. 282–287, No. 2003; Aug. 1, 1997; pp. 1231–1232.

Shogo Imada et al; "Epitaxial Growth of Ferroelectric YmnO$_3$ Thin Films on Si (111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)–BN–Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of ZnO/SiO$_2$/Si Monolithic Integrated Programmable SAW Filter"; Proceedings of Fifth International Conference on Solid–State and Integrated Circuit Technology; Oct. 21–23, 1998; pp. 826–829.

Kirk–Othmer Encyclopedia of Chemical Technology; Fourth Edition, vol. 12; Fuel Resources to Heat Stabilizers; A Wiley–Interscience Publication; John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAiAs MODFETs and RTDs on InP–bonded–to Si Substrate"; Fourth International Conference on Indium Phosphide and Related Materials, Newport, RI, USA; Apr. 21–24, 1992, pp. 167–170; XP000341253; IEEE, New York, NY, USA; ISBN: 0–7803–0522–1.

H. Takahashi et al.; "Arrayed–Waveguide Grating For Wavelength Division Multi/Demultiplexer With Nanometre REsolution"; Electronics Letters; vol. 26., No. 2, Jan. 18th 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detectors Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Pervoskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Device Meeting, 1998, IEDM '98 Technical Digest; pp. 67–70.

Ben G. Streetman; "Solid State Electronic Device"; 1990, Prentice Hall; Third Edition; pp. 320–322.

A.Y Wu et al.; "High Oriented (Pb,La)(Zr,Ti)$O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

S.N. Subbarao et al.; "Monolithic PIN Photodector and FET Amplifier on GaAs–os–Si"; IEEE; GaAs IC Symposium–163–166; 1989.

T.A. Langdo et al.; "High Quality Ge on Si by Epitaxial Necking"; Applied Physics Letters; vol. 76; No. 25; pp. 3700–3702; Jun. 19, 2000.

Chenning Hu et al.; Solar Cells From Basics to Advanced Systems; McGraw–Hill Book Company; 1983.

O.J. Painter et al; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw "Epitaxial GaAs on Si: Progress and Potential Applications"; Mat. Res. Soc. Symp. Proc.; pp. 15–30; 1987.

G.J.M. Dormans, et al.; "PbTiO/$_3$/Thin Films Grown by Organometallic Chemical Vapour Deposition"; Third International Symposium on Integrated Ferroelectrics; Apr. 3–5, 1991 (Abstract).

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhaced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BatiO3/SrTiO3 epitaxial thin film heterostructures"; J. Phys. D: Appl. Phys. 32 (1999) 380–387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20; Jun. 19–21, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 12, 2002; pp. 1–5.

S.A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAlAs Power HBTs for Mobile Communications"; Microwave Symposium Digest; 1993 IEEE; vol. 2.; pp. 549–552.

Y. Ota et al.; "Application of Heterojunction FET to Power Amplifier for Cellular Telephone"; Electronics Letters, May 26th, 1994; vol. 30, No. 11; pp. 906–907.

Keiichi Sakuno et al; "A 3.5W HBT MMIC Power Amplifier Module for Mobile Communications"; IEEE 1994; Microwave and Millimeter–Wave Monolithic Circuits Symposium; pp. 63–66.

Mitsubishi Semiconductors Press Release (GaAs FET's) Nov. 8, 1999 pp. 1–2.

R.J. Matyi et al; "Selected Area Heteroepitaxial Growth of GaAs on Silicon for Advanced Device Structures"; 2194 Thin Solid Films; 181 Dec. 10, (1989); No. 1; pp. 213–225.

K. Nashimoto et al; "Patterning of Nb, LaOnZr, TiO3 Waveguides for Fabricating Micro–Optics Using Wet Etching and Solid–Phase Epitaxy"; Applied Physics Letters; vol. 75, No. 8; Aug. 23, 1999; pp. 1054–1056.

Bang–Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837–840.

Man Fai Ng et al; "Heteroepitaxial growth of Ianthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth and Properties of Ferromagnetic Co–Doped TiO2 Anatase"; Applied Physics Letters; vol. 79, No. 21; Nov. 19, 2001; pp. 3467–3469.

* cited by examiner

FERROMAGNETIC SEMICONDUCTOR STRUCTURE AND METHOD FOR FORMING THE SAME

FIELD OF THE INVENTION

The present invention relates generally to ferromagnetic semiconductors, and more particularly to semiconductor structures and devices and methods for forming semiconductor structures and devices that include a ferromagnetic material layer formed overlying a monocrystalline semiconductor material layer.

BACKGROUND OF THE INVENTION

Magnetoelectronic devices, spin electronic devices and spintronic devices are synonymous terms for devices that use effects predominantly caused by electron spin. Spintronic devices are electronic devices that utilize the correlation between the charge and spin of electrons to bring about spin-dependent electronic functionality. Spintronic effects can be used in numerous information devices, and provide non-volatile, reliable, radiation resistant, and high-density data storage and retrieval. The numerous spintronic devices include, but are not limited to, magnetic random access memory (MRAM), magnetic sensors, spin transistors, spin valves and read/write heads for disk drives.

Ferromagnetic semiconductor materials are of considerable interest as spin injectors for spintronic devices. Dilute magnetic semiconductors, such as manganese-doped II–VI and III–V semiconductors, which are obtained by doping magnetic impurities into host semiconductors, have become of considerable interest for their ferromagnetic properties. However, a major drawback for conventional III–V and II–VI semiconductors doped with magnetic ions is that generally the measured Curie points are well below room temperature. Thus, production of such ferromagnetic semiconductor devices has not been commercially successful. Cobalt-doped titanium oxide anatase has been reported to have a Curie point above room temperature. However, growth of this material has been achieved on oxide substrates such as strontium titanate and lanthium aluminate substrates. For large-scale commercial viability such material should be integrated on conventional monocrystalline semiconductor substrates such as silicon, germanium, or gallium arsenide.

Accordingly, there is a need for a ferromagnetic semiconductor structure having a Curie point above room temperature and a method for making such a structure. There is also a need for a ferromagnetic semiconductor structure that is formed overlying a monocrystalline semiconductor substrate and a method for making such a structure. Other desirable features and characteristics of the present invention will become apparent from the subsequent description and the appended claims, taken in conjunction with the accompanying drawings.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

The following detailed description is of exemplary embodiments only and is not intended to limit the invention or the application and uses of the invention. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
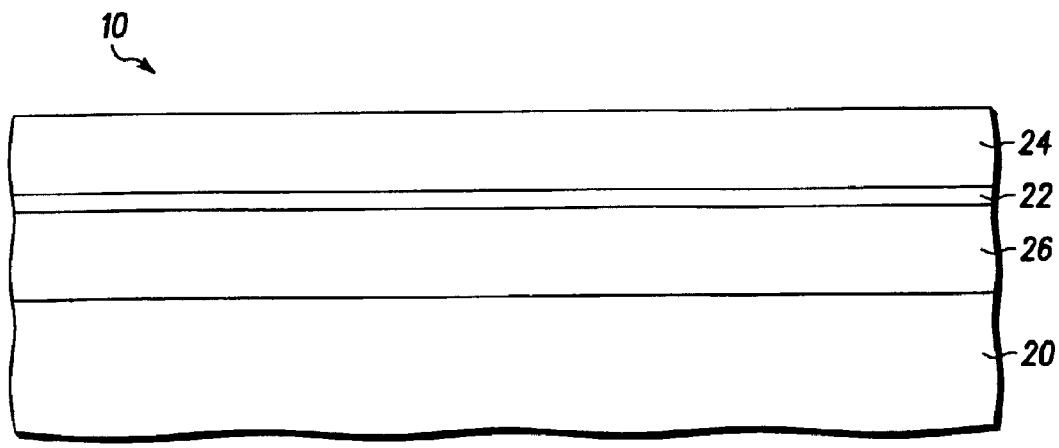
FIG. 1 illustrates schematically, in cross section, a device structure in accordance with an exemplary embodiment of the invention.

FIG. 1 illustrates schematically, in cross section, a portion of a semiconductor structure 10 in accordance with an embodiment of the invention. Semiconductor structure 10 includes a semiconductor substrate 20 and a ferromagnetic material layer 24.

Substrate 20, in accordance with an exemplary embodiment of the invention, is a monocrystalline semiconductor wafer. The wafer can be of, for example, a material from Group IV or Groups III–V of the periodic table. Examples of Group IV semiconductor materials include silicon, germanium, mixed silicon and germanium, mixed silicon and carbon, mixed silicon, germanium and carbon, and the like. Examples of Group III–V materials suitable for substrate 20 include gallium arsenide, aluminum gallium arsenide, indium gallium arsenide and the like. Preferably, substrate 20 is a high quality monocrystalline silicon wafer as commonly used in the semiconductor industry. Substrate 20 may also be, for example, silicon-on-insulator (SOI), where a thin layer of silicon is on top of an insulating material such as silicon oxide, glass or sapphire.

Ferromagnetic material layer 24 may be formed of a doped titanium oxide anatase material that may be doped with any suitable material, such as, for example, chromium (Cr), manganese (Mn), iron (Fe), cobalt (Co), nickel (Ni), the oxidation phases of these materials, and a combination of these materials and/or their oxidation phases. The doped titanium oxide anatase material (hereinafter M-doped $TiO_x$ anatase, where M is the dopant and $x \leq 2$) has a Curie temperature above room temperature, which makes it a preferable ferromagnetic material for forming magnetic semiconductor devices. By increasing the dopant content of M-doped $TiO_x$ anatase, the magnetic properties of the material may be enhanced. Accordingly, the dopant content of the M-doped $TiO_x$ anatase may be selected to produce suitable magnetic properties of the material required for desired applications. Ferromagnetic material layer 24 may have any thickness suitable for a desired application.

In accordance with one exemplary embodiment of the present invention, structure 10 also may comprise an accommodating buffer layer 22. Accommodating buffer layer 22 is preferably a monocrystalline oxide or nitride material selected for its crystalline compatibility with the underlying substrate 20. It may also be selected for its crystalline compatibility with the overlying ferromagnetic material layer 24. In another exemplary embodiment of the invention, accommodating buffer layer 22 may be selected to serve as a barrier to reduce or eliminate any adverse reaction between ferromagnetic material layer 24 and semiconductor substrate 20. Materials that are suitable for the accommodating buffer layer include metal oxides such as alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and other perovskite oxide materials, lanthanum oxide and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxides or nitrides typically include at least two different metallic elements. In some specific applications, the metal oxides or nitrides may include three or more different metallic elements. Accommodating buffer layer 22 may also include the above metal oxides and/or nitrides that have been doped with materials suitable for doping ferromagnetic material layer 24, such as, for example, Cr, Mn, Fe, Co, Ni, the oxidation phases of these materials and a combination of these materials and/or their oxidation phases. Preferably, accommodating buffer layer 22 comprises strontium titanate ($SrTiO_3$). Accommodating buffer layer 22 may have a thickness in the range of from about 1 to about 50 monolayers and preferably has a thickness in the range of from about 2 to about 5 monolayers.

In accordance with another exemplary embodiment of the invention, structure 10 also could include an amorphous interface layer 26 positioned between semiconductor substrate 20 and accommodating buffer layer 24. Amorphous interface layer 26 is preferably an oxide formed by the oxidation of the surface of semiconductor substrate 20, and more preferably is composed of silicon oxide. Typically, amorphous interface layer 26 has a thickness in the range of approximately 0.3 to 4.0 nm.

Figure 2:
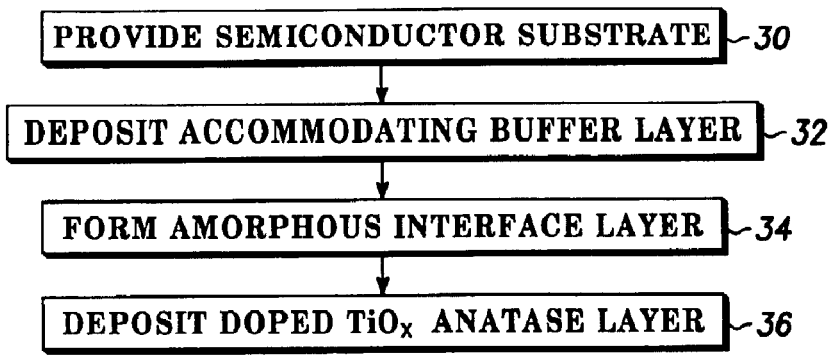
FIG. 2 is a flowchart of a method for forming a device structure in accordance with an exemplary embodiment of the invention.

The following example illustrates a method, in accordance with one embodiment of the invention, for fabricating a semiconductor structure such as structure 10 depicted in FIG. 1. Referring to FIG. 2, the method starts at step 30 by providing a monocrystalline semiconductor substrate comprising a material selected from Group IV or Group III–V of the periodic table. In accordance with a preferred embodiment of the invention, the semiconductor substrate is a silicon wafer having a (100) orientation. The substrate is oriented on axis or, at most, about 6° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. To epitaxially grow a monocrystalline layer overlying the monocrystalline substrate, the native oxide layer must first be removed to expose the crystalline structure of the underlying substrate. The following process is preferably carried out by molecular beam epitaxy (MBE), although other epitixial processes may also be used in accordance with the present invention. The native oxide can be removed by first thermally depositing a thin layer (preferably 1–3 monolayers) of strontium, barium, a combination of strontium and barium, or other alkaline earth metals or combinations of alkaline earth metals in an MBE apparatus. In the case where strontium is used, the substrate is then heated to a temperature above 720° C. as measured by an optical pyrometer to cause the strontium to react with the native silicon oxide layer. The strontium serves to reduce the silicon oxide to leave a silicon oxide-free surface. The resultant surface may exhibit an ordered (2×1) structure. If an ordered (2×1) structure has not been achieved at this stage of the process, the structure may be exposed to additional strontium until an ordered (2×1) structure is obtained. The ordered (2×1) structure forms a template for the ordered growth of an overlying layer. The template provides the necessary chemical and physical properties to nucleate the crystalline growth of an overlying layer.

It is understood that precise measurement of actual temperatures in MBE equipment, as well as other processing equipment, is difficult, and is commonly accomplished by the use of a pyrometer or by means of a thermocouple placed in close proximity to the substrate. Calibrations can be performed to correlate the pyrometer temperature reading to that of the thermocouple. However, neither temperature reading is necessarily a precise indication of actual substrate temperature. Furthermore, variations may exist when measuring temperatures from one MBE system to another MBE system. For the purpose of this description, typical pyrometer temperatures will be used, and it should be understood that variations may exist in practice due to these measurement difficulties.

In accordance with an alternate embodiment of the invention, the native silicon oxide can be converted and the substrate surface can be prepared for the growth of an overlying monocrystalline layer by depositing an alkaline earth metal oxide, such as strontium oxide, strontium barium oxide, or barium oxide, onto the substrate surface by MBE at a low temperature and by subsequently heating the structure to a temperature of above 720° C. At this temperature a solid state reaction takes place between the strontium oxide and the native silicon oxide causing the reduction of the native silicon oxide and leaving an ordered (2×1) structure on the substrate surface. If an ordered (2×1) structure has not been achieved at this stage of the process, the structure may be exposed to additional strontium until an ordered (2×1) structure is obtained. Again, this forms a template for the subsequent growth of an overlying monocrystalline layer.

In one exemplary embodiment of the invention, the method may continue by depositing an accommodating buffer layer overlying the semiconductor substrate, as illustrated in step 32 of FIG. 2. Following the removal of the silicon oxide from the surface of the substrate, in accordance with one embodiment of the invention, the substrate is cooled to a temperature in the range of about 200–600° C., preferably about 250–350° C., more preferably about 300° C., and a layer of strontium titanate is grown on the template layer by MBE. The MBE process is initiated by opening shutters in the MBE apparatus to expose strontium, titanium and oxygen sources. The ratio of strontium and titanium is approximately 1:1 and the partial pressure of oxygen is set at about $1 \times 10^{-8}$ Torr to $5 \times 10^{-7}$ Torr. The strontium titanate layer then is permitted to grow to a thickness in the range of about 1–50 monolayers, preferably about 2 to 5 monolayers. The stoichiometry of the strontium titanate can be controlled during growth by monitoring RHEED patterns and adjusting the metal fluxes.

After initiating growth of the strontium titanate, the partial pressure of oxygen may be increased above the initial value when an amorphous interface layer is desirable. The overpressure of oxygen causes the growth of an amorphous silicon oxide layer at the interface between the underlying substrate and the strontium titanate layer, as illustrated in step 34 of FIG. 2. This step may be applied either during or after the growth of the strontium titanate layer. The growth of the amorphous silicon oxide layer results from the diffusion of oxygen through the strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate.

A Co-doped $TiO_x$ anatase layer then may be formed overlying the strontium titanate layer, as illustrated in step 36 of FIG. 2 (or overlying the semiconductor substrate when no accommodating buffer layer has been formed). To grow the Co-doped $TiO_x$ anatase layer ($x \leq 2$), the temperature of the substrate is caused to be in the range of about 300° C. to about 700° C., preferably about 500° C., the shutter exposing strontium in the MBE apparatus is closed, and a shutter exposing cobalt is opened in the MBE apparatus. Preferably, the doping level of cobalt in the $TiO_x$ anatase should not exceed about 15%. The partial pressure of oxygen is raised to be within a range of about $5 \times 10^{-7}$ Torr to about $5 \times 10^{-5}$ Torr.

In one exemplary embodiment of the invention, the Co-doped $TiO_x$ anatase layer is grown in sub-layers with intermittent high temperature anneals. In a preferred embodiment of the invention, approximately 2.0–3.0 nm of the Co-doped $TiO_x$ anatase layer is grown overlying the strontium titanate layer and is then subjected to an anneal at a temperature in the range of about 550° C. to about 700° C., preferably about 600° C. to about 650° C., for about 0.5 to 10 minutes. The substrate is then cooled to about 300° C. to about 500° C., preferably to a temperature of about 500° C., and an additional layer of Co-doped $TiO_x$ anatase is grown overlying the initial layer of Co-doped $TiO_x$ anatase using the process described above. Preferably, about another 2.0–3.0 nm of Co-doped $TiO_x$ anatase is grown and the substrate is again subjected to a high temperature anneal as described above. The alternating of Co-doped $TiO_x$ anatase layer growth with high temperature annealing may be continued for the entire deposition of the Co-doped $TiO_x$ anatase layer. In an alternative embodiment, the alternating of Co-doped $TiO_x$ anatase layer growth with high temperature annealing may be continued until at least two anneal procedures have been executed and the remainder of the Co-doped $TiO_x$ anatase layer may be grown uninterrupted. In yet another alternative embodiment of the invention, the alternating of Co-doped $TiO_x$ anatase layer growth with high temperature annealing may be continued until at least two anneal procedures have been executed, at which point the substrate may be cooled to a higher growth temperature, preferably about 550° C. to 650° C., and the remainder of the Co-doped $TiO_x$ anatase layer may be grown uninterrupted.

While it is preferable to grow the Co-doped $TiO_x$ anatase layer with intermittent high temperature anneals, it will be appreciated that, in another exemplary embodiment of the invention, the Co-doped $TiO_x$ anatase layer may be grown without any high temperature annealing.

In one exemplary embodiment of the invention, a $TiO_x$ anatase layer may be grown overlying the strontium titanate layer (or overlying the semiconductor substrate when no accommodating buffer layer has been formed) before a shutter exposing the cobalt source is exposed. To grow the $TiO_x$ anatase layer, the temperature of the substrate is caused to be in the range of about 300° C. to about 700° C., preferably about 500° C., and the shutter exposing strontium in the MBE apparatus is closed while the titanium and oxygen shutters remain open. The $TiO_x$ anatase layer may be grown to any desired thickness, preferably in the range of about 5 to 10 monolayers. A shutter exposing cobalt is then opened in the MBE apparatus and Co-doped $TiO_x$ anatase is grown as described in more detail above.

The process described above illustrates a process for forming a semiconductor structure including a silicon substrate, an accommodating buffer layer and a ferromagnetic layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as those formed from alkaline earth metal titanates, zirconates, hafnates, tantalates, vanadates, ruthenates, niobates, alkaline earth metal tin-based perovskites, lanthanum aluminate, lanthanum scandium oxide, lanthanum oxide, and gadolinium oxide can also be grown. It also will be appreciated that, as described above, the ferromagnetic layer may be formed on the semiconductor substrate without an accommodating buffer layer formed therebetween.

Figure 3:
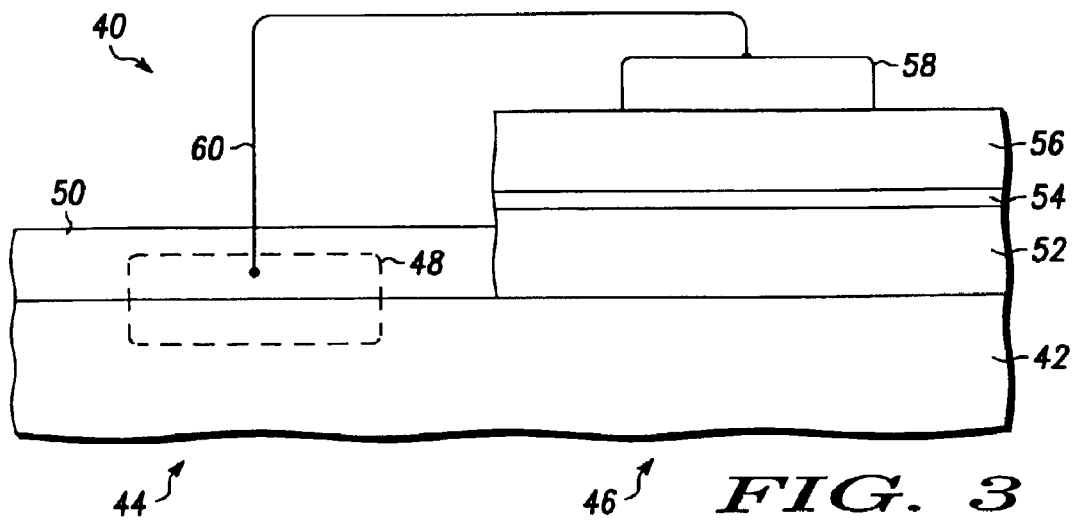
FIG. 3 illustrates schematically, in cross section, a device structure that can be used in accordance with various embodiments of the invention.

FIG. 3 illustrates schematically, in cross section, a device structure 40 in accordance with a further embodiment. Device structure 40 includes a monocrystalline semiconductor substrate 42, preferably a monocrystalline silicon wafer. Monocrystalline semiconductor substrate 42 includes two regions, 44 and 46. A semiconductor component generally indicated by the dashed line 48 is formed, at least partially in region 44. Semiconductor component 48 can be a resistor, a capacitor, an active electrical component such as a diode or a transistor, or an integrated circuit such as a CMOS integrated circuit configured to perform digital signal processing or another function for which silicon integrated circuits are well suited. The electrical semiconductor component in region 44 can be formed by conventional semiconductor processing as is well known and widely practiced in the semiconductor industry. A layer of insulating material 50 such as a layer of silicon dioxide or the like may overlie semiconductor component 48.

Insulating material 50 and any other layers that may have been formed or deposited during the processing of semiconductor component 48 in region 44 are removed from the surface of region 46 to provide a bare silicon surface in that region. As is well known, bare silicon surfaces are highly reactive and a native silicon oxide layer can quickly form on the bare surface. A layer (preferably 1–3 monolayers) of strontium or strontium and oxygen is deposited onto the native oxide layer on the surface of region 46 and is reacted with the oxidized surface to form a first template layer (not shown). In accordance with one embodiment, a monocrystalline accommodating buffer layer 54 is formed overlying the template layer by a process of MBE. Reactants including strontium, titanium and oxygen are deposited onto the template layer to form accommodating buffer layer 54. Initially during the deposition the partial pressure of oxygen is kept near the minimum necessary to fully react with the strontium and titanium to form a monocrystalline strontium titanate layer. The partial pressure of oxygen then may be increased to provide an overpressure of oxygen and to allow oxygen to diffuse through the growing monocrystalline accommodating buffer layer. The oxygen diffusing through the strontium titanate reacts with silicon at the surface of region 46 to form an amorphous interface layer 52 of silicon oxide on second region 46 and at the interface between silicon substrate 42 and the monocrystalline oxide layer 54.

A ferromagnetic material layer 56 then is deposited overlying the accommodating buffer layer. Reactants including cobalt, titanium and oxygen are deposited onto the accommodating buffer layer to form the ferromagnetic material layer 56, which is preferably formed of Co-doped $TiO_x$ anatase.

In accordance with a further embodiment of the invention, a semiconductor component 58 is formed overlying ferromagnetic material layer 56 and is electrically coupled to ferromagnetic material layer 56. Semiconductor component 58 may be any active or passive component, such as a metal electrode, light emitting diode, or other component that utilizes and takes advantage of the magnetic properties of ferromagnetic material layer 56. A metallic conductor schematically indicated by the line 60 can be formed to electrically couple device 58 with device 48. Although illustrative structure 40 has been described as a structure formed on a silicon substrate 42 and having a strontium titanate accommodating buffer layer 54 and a Co-doped $TiO_x$ anatase ferromagnetic material layer 56, similar devices can be fabricated using other substrates, accommodating buffer layers and ferromagnetic material layers as described elsewhere in this disclosure.

Thus it is apparent that there has been provided, in accordance with the invention, a ferromagnetic semiconductor structure that fully meets the needs set forth above. The structure comprises a ferromagnetic material layer formed overlying a monocrystalline semiconductor material layer and the semiconductor structure has a Curie point above room temperature. Although various embodiments of the invention have been described and illustrated with reference to specific embodiments thereof, it is not intended that the invention be limited to such illustrative embodiments. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor structure comprising:
    a monocrystalline semiconductor substrate;
    an amorphous oxide material in contact with the monocrystalline silicon substrate,
    a monocrystalline metal oxide selected from the group consisting of alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, gadolinium oxide and mixtures thereof contacting the amorphous oxide material; and
    a doped $TiO_x$ anatase layer overlying said monocrystalline semiconductor substrate, where $x \leq 2$.

2. A semiconductor structure comprising:
    a monocrystalline semiconductor substrate; and
    a doped $TiO_x$ anatase layer overlying said monocrystalline semiconductor substrate, where $x \leq 2$,
    said semiconductor structure further comprising an accommodating buffer layer overlying said monocrystalline semiconductor substrate and underlying said doped $TiO_x$ anatase layer, and an amorphous interface layer overlying said monocrystalline semiconductor substrate and underlying said accommodating buffer layer.

3. The semiconductor structure of claim 1, wherein said monocrystalline semiconductor substrate comprises at least one of a Group IV and a Group III–V material.

4. A semiconductor structure comprising:
    a monocrystalline semiconductor substrate; and
    a doped $TiO_x$ anatase layer overlying said monocrystalline semiconductor substrate, where $x \leq 2$,
    said semiconductor structure further comprising an accommodating buffer layer overlying said monocrystalline semiconductor substrate and underlying said doped $TiO_x$ anatase layer, wherein said accommodating buffer layer comprises at least one material selected from the group consisting of an alkaline earth metal titanate, an alkaline earth metal zirconate, an alkaline earth metal hafnate, an alkaline earth metal tantalate, an alkaline earth metal ruthenate, an alkaline earth metal niobate, an alkaline earth metal vanadate, an alkaline earth metal tin-based perovskite, lanthanum aluminate, lanthanum scandium oxide, lanthanum oxide, gadolinium oxide, gallium nitride, aluminum nitride, boron nitride, and said materials doped with at least one of chromium (Cr), manganese (Mn), iron (Fe), cobalt (Co), nickel (Ni) and the oxidation phases of Cr, Mn, Fe, Co and Ni.

5. The semiconductor structure of claim 2, the amorphous interface layer comprising a silicon oxide.

6. The semiconductor structure of claim 2, the amorphous interface layer having a thickness in the range of about 0.3 to about 4.0 nm.

7. The semiconductor structure of claim 1, wherein said doped $TiO_x$ anatase layer comprises at least one dopant selected from the group consisting of at least one of chromium (Cr), manganese (Mn), iron (Fe), cobalt (Co), nickel (Ni) and the oxidation phases of Cr, Mn, Fe, Co and Ni.

8. A semiconductor device structure comprising:
    a monocrystalline semiconductor substrate;
    a doped $TiO_x$ anatase layer overlying said monocrystalline semiconductor substrate, where $x \leq 2$;
    a first semiconductor component, at least a portion of which is formed in said monocrystalline semiconductor substrate; and
    a second semiconductor component formed overlying said doped $TiO_x$ anatase layer, said second semiconductor component being electrically coupled to said first semiconductor component.

9. The semiconductor device structure of claim 8, further comprising an accommodating buffer layer overlying said monocrystalline semiconductor substrate and underlying said doped $TiO_x$ anatase layer.

10. The semiconductor device structure of claim 9, further comprising an amorphous interface layer overlying said monocrystalline semiconductor substrate and underlying said accommodating buffer layer.

11. The semiconductor device structure of claim 8, said monocrystalline semiconductor substrate comprising at least one of a Group IV and a Group III–V material.

12. The semiconductor device structure of claim 9, said accommodating buffer layer comprising at least one material selected from an alkaline earth metal titanate, an alkaline earth metal zirconate, an alkaline earth metal hafnate, an alkaline earth metal tantalate, an alkaline earth metal ruthenate, an alkaline earth metal niobate, an alkaline earth metal vanadate, an alkaline earth metal tin-based perovskite, lanthanum aluminate, lanthanum scandium oxide, lanthanum oxide, gadolinium oxide, gallium nitride, aluminum nitride, boron nitride, and said materials doped with at least one of chromium (Cr), manganese (Mn), iron (Fe), cobalt (Co), nickel (Ni) and the oxidation phases of Cr, Mn, Fe, Co and Ni.

13. The semiconductor device structure of claim 9, said accommodating buffer layer having a thickness in the range of about 1 to 50 monolayers.

14. The semiconductor device structure of claim 10, the amorphous interface layer having a thickness in the range of about 0.3 to about 4.0 nm.

15. The semiconductor device structure of claim 8, said doped $TiO_x$ anatase layer comprising a dopant selected from at least one of chromium (Cr), manganese (Mn), iron (Fe), cobalt (Co), nickel (Ni) and the oxidation phases of Cr, Mn, Fe, Go, and Ni.

* * * * *